(12) United States Patent
Foster et al.

(10) Patent No.: US 7,332,212 B2
(45) Date of Patent: Feb. 19, 2008

(54) CIRCUITIZED SUBSTRATE WITH CONDUCTIVE POLYMER AND SEED MATERIAL ADHESION LAYER

(75) Inventors: Elizabeth Foster, Friendsville, PA (US); Gregory Kevern, Endwell, NY (US); Anita Sargent, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 141 days.

(21) Appl. No.: 11/242,841

(22) Filed: Oct. 5, 2005

(65) Prior Publication Data

US 2006/0029781 A1 Feb. 9, 2006

Related U.S. Application Data

(62) Division of application No. 10/643,909, filed on Aug. 20, 2003, now Pat. No. 7,063,762.

(51) Int. Cl.
*B32B 3/00* (2006.01)
*H05K 1/02* (2006.01)

(52) U.S. Cl. .............. 428/209; 428/901; 174/258; 174/259; 252/510; 252/511; 252/514

(58) Field of Classification Search .......... 428/209, 428/901; 174/258, 259; 252/510, 511, 514
See application file for complete search history.

(56) References Cited

U.S. PATENT DOCUMENTS

| | | | |
|---|---|---|---|
| 3,099,608 A * | 7/1963 | Radovsky et al. ......... 205/123 |
| 4,581,301 A * | 4/1986 | Michaelson ................ 428/551 |
| 5,106,473 A | 4/1992 | Whitlaw et al. |
| 5,300,208 A | 4/1994 | Angelopoulos et al. |
| 5,427,841 A | 6/1995 | De Leeuw et al. |
| 5,591,285 A * | 1/1997 | Afzali-Ardakani et al. 156/62.2 |
| 5,620,800 A | 4/1997 | De Leeuw et al. |
| 5,709,906 A * | 1/1998 | Bickford et al. ........... 427/306 |
| 5,818,700 A | 10/1998 | Purinton |
| 5,854,514 A | 12/1998 | Roldan et al. |
| 5,986,046 A | 11/1999 | Nishiyama et al. |
| 6,063,481 A * | 5/2000 | Arrington et al. ......... 428/209 |
| 6,212,769 B1 * | 4/2001 | Boyko et al. ................ 29/852 |
| 6,815,126 B2 * | 11/2004 | Fey et al. ...................... 430/9 |
| 6,852,152 B2 * | 2/2005 | Galasco et al. ............ 106/1.11 |
| 6,899,829 B2 * | 5/2005 | Shelnut et al. ............ 427/97.1 |
| 6,962,642 B2 * | 11/2005 | Knadle et al. ........... 156/273.9 |
| 7,063,762 B2 * | 6/2006 | Foster et al. ................ 156/150 |

* cited by examiner

*Primary Examiner*—Cathy F. Lam
(74) *Attorney, Agent, or Firm*—Hinman, Howard & Kattell, LLP; Lawrence R. Fraley

(57) ABSTRACT

A method of making a circuitized substrate such as a laminate chip carrier in which a polymer, e.g., Teflon, is used as a dielectric layer and a promotion adhesion layer of a polymer is used to securely adhere a conductive layer thereto which is deposited by plating. The resulting product is thus able to provide extremely narrow conductive circuitry for subsequent connections, e.g., to a semiconductor chip. Electroless plating is the preferred plating method with the dielectric immersed in a solution of conductive monomers, e.g., pyrrole monomer, the solution also possibly containing a seed material such as palladium-tin.

6 Claims, No Drawings

CIRCUITIZED SUBSTRATE WITH CONDUCTIVE POLYMER AND SEED MATERIAL ADHESION LAYER

CROSS REFERENCE TO CO-PENDING APPLICATION

This application is a divisional application of Ser. No. 10/643,909, filed Aug. 20, 2003 now U.S. Pat. No. 7,063,762, and entitled "Circuitized Substrate And Method of Making Same" (inventors: E. Foster et al).

TECHNICAL FIELD

The invention relates to circuitized substrates such as printed circuit boards (PCBs), laminated chip carriers, and the like. More particularly, the invention relates to such substrates which utilize a plated conductive layer on a dielectric layer to form a specific circuit pattern, e.g., of lines or pads. As further defined, the invention also relates to a method of making such a substrate.

BACKGROUND OF THE INVENTION

PCBs are, of course, well known in the art and typically include a plurality of dielectric layers having individual conductive layers therein. A typical dielectric layer is known in the industry as "FR4" material which is a fiberglass reinforced polymeric resin material which is provided in layer form and laminated with other layers to form a multilayered PCB final structure. Before such final lamination, each layer is typically circuitized to form a pattern of conductors thereon (e.g., if a signal layer) or the conductor may be in substantially solid form to comprise a power layer for the resulting PCB. Such circuitization may occur following a lamination of the base metal (copper) followed by known processes such as pattern deposition and etching to remove the undesired copper and form the desired pattern of lines and/or pads. Such a procedure, if etching is utilized, is also known as a subtractive process because the conductive material is being removed following initial deposition.

Another process for circuitizing dielectric substrates is referred to as additive plating because layers of the conductive material are built up in the deposited pattern. One advantage of additive processing is the ability to form finer (smaller width, closer spaced) lines, thus assuring the miniaturization strongly emphasized in today's PCB and related packaging products field.

A similar product of more recent vintage than the common PCB is the laminated chip carrier. One such product is produced and sold by the assignee of this invention under the product name HyperBGA (HyperBGA is a registered trademark of Endicott Interconnect Technologies, Inc.). This unique product is much smaller in size than the typical PCB and is used to interconnect a semiconductor chip electrically coupled to a top surface of the product's laminate substrate to a PCB or other substrate on which the substrate is positioned and coupled, e.g., using solder balls. Solder balls or even wirebond connections may be used to couple the chip to the substrate's top conductive surface. Examples of such products are defined in pending application Ser. No. 10/394,107, filed Mar. 24, 2003, and Ser. No. 10/394,135, also filed Mar. 24, 2003, both assigned to the assignee of the instant invention.

A dielectric material desired for use in newer interconnect products such as laminate chip carriers and even in some PCBs is polytetrafluoroethylene (PTFE), the most common product name for this material being Teflon (Teflon is a registered trademark of E.I. duPont deNemours & Company). Teflon is considered desirable in such an environment because it has a very low dielectric constant, is extremely flexible and thus an excellent material to work with.

One problem of Teflon, however, is that it is considered relatively difficult to plate, especially if using an additive electroless plating operation due to non-optimum adhesion between metals and the dielectric. Understandably, strong adhesion of the final conductive layer (usually copper) is essential for such new products and must satisfy stringent peel and other tests to assure it will be securely attached to its underlayer of dielectric. This is especially true when the copper layer is to have solder balls or the aforementioned wires bonded thereto to form the necessary connections to the chip and/or PCB underneath.

It is believed, therefore, that a circuitized substrate that uses a polymer such as Teflon as its dielectric layer and has a plated conductive layer thereon which will strongly adhere to the dielectric will constitute a significant advancement in the art. It is further believed that a new and unique method of making such a product will also constitute an art advancement.

OBJECTS AND SUMMARY OF THE INVENTION

It is, therefore, a primary object of the invention to provide a circuitized substrate usable in such products as PCBs and laminated chip carriers in which a plated conductive layer is utilized which will strongly adhere to the substrate's layer.

It is another object of the instant invention to provide a method of making such a circuitized substrate which can be performed in a facile and relatively inexpensive manner.

According to one aspect of the invention, there is provided a method of making a circuitized substrate comprising providing a dielectric polymer layer, forming an adhesion promotion layer on the dielectric polymer layer using a polymer, and thereafter plating a layer of conductive material on the adhesion promotion layer to form a circuit element.

According to another aspect of the invention, there is provided a circuitized substrate comprising a dielectric polymer layer, an adhesion promotion layer on the dielectric polymer layer including a polymer, and a plated layer of conductive material on the adhesion promotion layer, the plated layer being a circuit element.

BEST MODE FOR CARRYING OUT THE INVENTION

For a better understanding of the present invention, together with other and further objects, advantages and capabilities thereof, reference is made to the following disclosure and appended claims.

As understood from the foregoing, the present invention involves the provision of a polymeric inner layer between a polymer dielectric material for the purpose of promoting adhesion to the dielectric of a plated conductive metallic material.

As defined, the polymeric inner layer is a conductive polymer, thereafter remaining conductive or rendered non-conductive, to act as an "anchor" for the resulting conductive film (e.g., copper), which is plated, preferably using an electroless plating process. Electroless plating of copper is preferred for deposition of the conductive material on the substrate of the invention for the reasons stated above, especially the ability to form fine line circuitry and pad configurations. In a typical electroless plating operation as used herein, a reducing agent such as formaldehyde is added to a solution of copper ions, which are chemically reduced at the properly catalyzed surface. The electroless copper solution may also typically contain complexing agents, stabilizers and/or accelerating agents that, together, function to optimize Cu grain growth and stabilize plating rate.

In accordance with the teachings herein, it is possible to use an alternative plating process, such as electroplating. In such a process, the copper layer is deposited using the following steps. The conductive polymer layer is first deposited, rendering the surface conductive as long as the polymer is sufficiently conductive after preparation. Copper can then be directly electroplated onto the surface, whereby the conductive polymer acts as a less conductive substitution for electroless copper. Although electroplating is possible, electroless plating represents a preferred method of providing the copper conductive layer for the eventual circuitry as part of the invention.

The improved adhesion of the plated copper to a polymer such as Teflon translates into improved reliability of the resulting product (e.g., a laminated chip carrier as defined above), all at a lower cost. Uniquely, the invention is thus able to overcome the previously believed difficulties of effective adherence of conductive metallic material to a Teflon dielectric material or material having similar properties, to thus effectively allow the use of such polymer dielectric materials desired for products such as the more recently developed HyperBGA® chip carrier manufactured and sold by the assignee of the present invention.

In accordance with the teachings herein, two different methods were utilized to produce a circuitized substrate. In a first method, a layer of Teflon having a thickness of about 0.010 inch (or 10 mils) was immersed in a solution including a palladium-tin seed material and a conductive monomer (pyrrole), the monomer comprising about 0.05% by weight of the solution. The immersion time was from about one minute to about six minutes and the solution established at a temperature of from about 20 degrees Celsius (C) to about 30 degrees C. The treated dielectric layer was then removed and rinsed (e.g., using de-ionized water) and dried. Following this, the treated dielectric was exposed to an electroless plating metallization process and a total thickness of from about 30 microinches to about 80 microinches of copper was plated.

In a slight alternative to the above method, sodium persulfate was added as an oxidant, the persulfate comprising about ten grams per liter of the total solution. The palladium-tin and pyrrole monomer were also utilized.

Samples using the above alternative versions of this method provided circuit lines with excellent copper line peel strength properties. For example, samples of Teflon seeded with the palladium-tin and pyrrole monomer composition had lines with a peel strength of from about 3.0 pounds per square inch (psi) to about 3.5 psi. Those wherein the sodium persulfate was added as a oxidant possessed an average copper line peel strength of about 2.3 psi.

Although pyrrole monomer is defined as one of the monomers capable of being used in the invention, at least two others are possible, a first being aniline monomer and a second being thiophene monomer. It is believed that these three monomers will provide the greatest adhesion promotion for a subsequently deposited electroless copper layer formed on a Teflon dielectric using the teachings of the present invention.

In an alternative method for providing an adhesion promotion layer on a polymer dielectric such as Teflon, a layer of Teflon having a thickness of about 0.001 inch was immersed in a simple solution of aniline monomer for a period of from about one to about five minutes prior to removal and rinse using de-ionized water. The aniline of the solution was at a ratio of 0.5 milliliters per liter and the solution had a temperature of about 20 degrees C. to about 30 degrees C., with a preferred range of from about 21 degrees C. to about 26 degrees C. Following rinsing and drying, an electroless plating bath was utilized to deposit the desired copper thickness. The resulting thickness was obtained by sequential layer deposition as described in the first alternative above for a resulting thickness of about 30 microinches to about 80 microinches.

In the first alternative of the first method defined above, the resulting properties suggest that the addition of a monomer such as pyrrole monomer to a seed material such as palladium-tin significantly enhances the adhesion of electroless copper when the polymer dielectric material is exposed to the compositions for the time periods stipulated herein. It is also understood that the invention is not limited to these specific compositions, times or temperatures in that others are possible to achieve the unique features of the present invention. To further enhance adhesion, the defined oxidant addition serves to oxidize the monomer within the solution's monomer (pyrrole) to form a polymer and that helps to anchor the growing electroless copper film and possibly catalyze electroless copper deposition in ways other than typical palladium-tin "seed" does.

Although the monomer percentage defined above of 0.05% is utilized, it is possible to use a solution wherein the monomer comprises from about 0.001 to about 0.100 percent, by weight, of the entire solution. It is further understood that oxidants other than sodium persulfate may be utilized, alternative examples being ferric chloride, cupric chloride and permanganate salt.

In one example of the invention, a copper line having a thickness of only about 0.001 inch (1 mil) was possible, thus indicating the fine line capabilities of the present invention to thus meet the strong emphasis on miniaturization in the laminate chip carrier and PCB field. The invention thus represents a significant advancement in this field.

Of further significance, the electroless plating operation as taught herein is accomplished without the use of formation of a conductive layer by the known process of sputtering. Sputtering represents a time-consuming and expensive process which can be avoided using a adhesion promotion layer and process as taught herein. This translates into a significant cost savings for the product produced by the present invention. Of further significance, the invention is able to avoid the need for sputtering while still providing a resulting product with fine line copper circuitry having significant peel strengths for the plated lines.

Should a multilayered chip carrier or PCB be desired, subsequent substrates may be formed and then bonded (using a typical lamination process) together to form the resulting, multilayered structure. Each subassembly of the structure would thus possess its own dielectric layer and desired circuit pattern thereon, the separated and electrically isolated conductive layers of the formed multilayer structure then being possibly electrically connected through the formation of conductive vias or plated through holes using known procedures. Lamination is a well-known process in forming circuit boards or smaller chip carriers and further description is not believed necessary.

As described in one of the methods taught above, the conductive polymer adhesion layer is formed in situ with a palladium-tin colloidal seed composition. The conductive polymer monomer may be oxidatively polymerized in the presence of a strong oxidant such as the described sodium persulfate, from $Sn^{2+}$ or $SN^{4+}$ present in the seed, or from $CU^{2+}$ or $CU^{1+}$ present in the electroless copper solution once contact between monomer and electroless copper solution is made. Oxidative polymerization using copper ions may also explain the tendency for polyaniline formation resulting from contact of the aniline monomer absorbed into the laminate with electroless copper bath (where no seed material is utilized).

The method and resulting product taught herein represent a significant advancement in the art through the utilization of electroless plating to effectively adhere conductive metallic material (especially copper) to a dielectric layer heretofore deemed extremely difficult to plate. The invention overcomes these difficulties in a facile, expeditious manner without the necessity of additional equipment, thus assuring a process and resulting structure of relatively minimal cost.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate comprising:
   a polytetrafluoroethylene dielectric layer;
   an adhesion promoting layer on said polytetrafluoroethylene dielectric layer and including a quantity of seed material and a conductive monomer; and
   an electrolessly plated copper layer bonded to said adhesion promoting layer, said electrolessly plated copper layer being a circuit including a plurality of lines each having a peel strength within the range of from about 2.3 pounds per square inch to about 3.5 pounds per square inch.

2. The circuitized substrate of claim 1 wherein said conductive monomer is selected from the group of monomers consisting of pyrrole monomer, aniline monomer, thiophene monomer and combinations thereof.

3. The circuitized substrate of claim 2 wherein said seed material comprises palladium-tin.

4. The circuitized substrate of claim 1 wherein each of said lines of said circuit of said electrolessly plated copper layer is only about 0.001 inch thick.

5. The circuitized substrate of claim 4 including at least one additional substrate bonded to said circuitized substrate.

6. The circuitized substrate of claim 1 wherein said conductive monomer is oxidatively polymerized.

* * * * *